US012791857B2

(12) United States Patent
Kumano et al.

(10) Patent No.: US 12,791,857 B2
(45) Date of Patent: Nov. 10, 2026

(54) DISPLAY DEVICE AND HEAD-UP DISPLAY

(71) Applicant: Panasonic Automotive Systems Co., Ltd., Kanagawa (JP)

(72) Inventors: Yutaka Kumano, Hyogo (JP); Daiki Kawai, Kanagawa (JP); Takuma Shimura, Kanagawa (JP); Kouzou Yuuki, Fukuoka (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 302 days.

(21) Appl. No.: 18/442,963

(22) Filed: Feb. 15, 2024

(65) Prior Publication Data

US 2024/0280810 A1 Aug. 22, 2024

(30) Foreign Application Priority Data

Feb. 21, 2023 (JP) ................................ 2023-025324

(51) Int. Cl.
*G02B 27/14* (2006.01)
*G02B 27/01* (2006.01)
*H05K 7/20* (2006.01)

(52) U.S. Cl.
CPC ..... *G02B 27/0149* (2013.01); *G02B 27/0101* (2013.01); *H05K 7/2039* (2013.01)

(58) Field of Classification Search
CPC ............ G02B 27/0149; G02B 27/0101; H05K 7/2039
USPC ...................... 345/7–9; 359/13–14, 630–633
See application file for complete search history.

(56) References Cited

U.S. PATENT DOCUMENTS 10,845,854 B1 * 11/2020 Winter .................... G06F 1/206
12,043,116 B2 * 7/2024 Akiyoshi ............... B60K 35/23

FOREIGN PATENT DOCUMENTS

JP 2016-031457 3/2016
JP 2022130236 A * 9/2022
WO WO-2018008236 A1 * 1/2018 ......... H05K 7/20336

* cited by examiner

*Primary Examiner* — Mahidere S Sahle
(74) *Attorney, Agent, or Firm* — Greenblum & Bernstein, P.L.C.

(57) ABSTRACT

A display device includes: a display panel that includes a display area that displays an image on a front surface and a peripheral area located outside the display area, and that projects light incident on a back surface from the display area as display light that represents the image; a heat sink disposed to face the back surface of the display panel; a light-transmitting member held between the display panel and the heat sink; and a temperature sensor disposed in the peripheral area of the display panel to detect a temperature of the display panel. When viewed in a direction perpendicular to the front surface of the display panel, the temperature sensor does not overlap with at least one of the heat sink or the light-transmitting member.

12 Claims, 10 Drawing Sheets

DISPLAY DEVICE AND HEAD-UP DISPLAY

CROSS REFERENCE TO RELATED APPLICATION

The present application is based on and claims priority of Japanese Patent Application No. 2023-025324 filed on Feb. 21, 2023.

FIELD

The present disclosure relates to a display device and a head-up display.

BACKGROUND

A head-up display (HUD) mounted on a vehicle is known. In this head-up display, by light from the backlight entering the back surface of the display panel and exiting from the display area on the front surface of the display panel, and the light from the display area being reflected by a mirror and projected onto the vehicle's windshield (front glass), a virtual image of the image displayed in the display area of the display panel is displayed superimposed on the scenery in front of the vehicle on the windshield of the vehicle.

In the head-up display mentioned above, when sunlight enters the vehicle interior from the outside of the vehicle through the windshield, is reflected by the mirror mentioned above, and is focused on the display area of the display panel, the display panel becomes hot and has a risk of damage. In order to avoid such an issue, a technique has been proposed in which by bringing the back surface of the display panel into contact with a heat sink through a light-transmitting member made of glass, the heat generated by the display panel due to sunlight is conducted to a heat sink through the light-transmitting member and heat is dissipated (for example, see Patent Literature (PTL) 1).

Furthermore, a technique related to a so-called fail-safe function has been proposed in which a temperature sensor is placed in the peripheral area outside of the display area in the front surface of the display panel, and when the temperature of the display panel detected by the temperature sensor exceeds a threshold value, the display panel is activated by displacing the mirror described above.

CITATION LIST

Patent Literature

PTL 1: Japanese Unexamined Patent Application Publication No. 2016-31457

SUMMARY

The conventional head-up display mentioned above can be improved upon.

In view of this, the present disclosure provides a display device and a head-up display capable of improving upon the above related art.

A display device according to one aspect of the present disclosure is a display device for use in a head-up display, the display device including: a display panel that includes a display area that displays an image on a front surface and a peripheral area located outside the display area, and that projects light incident on a back surface from the display area as display light that represents the image; a heat sink disposed to face the back surface of the display panel; a light-transmitting member held between the display panel and the heat sink; and a temperature sensor disposed in the peripheral area of the display panel to detect a temperature of the display panel, wherein when viewed in a direction perpendicular to the front surface of the display panel, the temperature sensor does not overlap with at least one of the heat sink or the light-transmitting member.

It should be noted that these comprehensive or specific aspects may be realized by a system, a method, an integrated circuit, a computer program, or a computer-readable recording medium such as a compact disc-read only memory (CD-ROM), and may be also realized in any combination of systems, methods, integrated circuits, computer programs, and recording media.

The display device and the like according to one aspect of the present disclosure is capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

Figure 1:
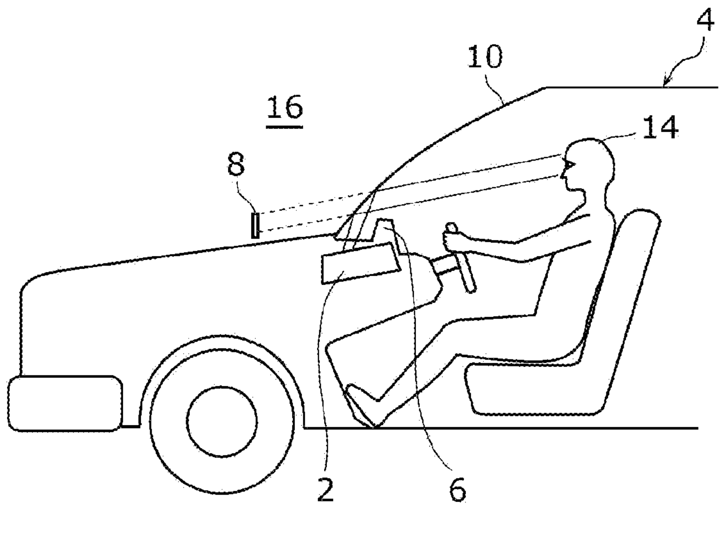
FIG. 1 is a diagram showing a vehicle equipped with a head-up display according to an embodiment.

DESCRIPTION OF EMBODIMENT (Underlying Knowledge Forming Basis of the Present Disclosure)

The present inventors have found that the following issue occur with the technology described in the "Background" section.

In the conventional head-up display mentioned above, an opening is formed in the heat sink corresponding to the display area of the display panel, and light from the backlight enters the back surface of the display panel through the opening in the heat sink. For that reason, in the display panel, heat is more easily dissipated by the heat sink in the peripheral area where the temperature sensor is disposed than at the center of the display area.

However, with such a configuration, the difference between the temperature at the center of the display area of the display panel and the temperature detected by the temperature sensor becomes large, which creates the issue that the fail-safe function may not be executed correctly.

In order to solve such problem, a display device according to a first aspect of the present disclosure is a display device for use in a head-up display, the display device including: a display panel that includes a display area that displays an image on a front surface and a peripheral area located outside the display area, and that projects light incident on a back surface from the display area as display light that represents the image; a heat sink disposed to face the back surface of the display panel; a light-transmitting member held between the display panel and the heat sink; and a temperature sensor disposed in the peripheral area of the display panel to detect a temperature of the display panel, wherein when viewed in a direction perpendicular to the front surface of the display panel, the temperature sensor does not overlap with at least one of the heat sink or the light-transmitting member.

According to this aspect, when viewed in a direction perpendicular to the front surface of the display panel, the temperature sensor does not overlap with at least one of the heat sink or the light-transmitting member. This makes it difficult for the heat from the temperature sensor to be dissipated by the heat sink, so the difference between the temperature at the center of the display area of the display panel and the temperature detected by the temperature sensor can be suppressed to a small value. As a result, it is possible to accurately estimate the temperature at the center of the display area of the display panel based on the temperature detected by the temperature sensor, and for example, it is possible to correctly perform a fail-safe function and the like.

For example, the display device according to Aspect 2 may be configured so that in Aspect 1, the display panel includes a plurality of optical members stacked, and when viewed in the direction perpendicular to the front surface of the display panel, a predetermined area including the temperature sensor is an area expanded outward from an outermost shape of the temperature sensor by more than or equal to a thickness of one or more optical members of the plurality of optical members, and is disposed at a position where the temperature sensor does not overlap with at least one of the heat sink or the light-transmitting member.

According to this aspect, when the optical member of the display panel is formed of an isotropic material, the heat of the temperature sensor spreads inside the optical member in a diagonal direction with respect to the vertical line. Even in such a case, it is possible to more effectively suppress the heat from the temperature sensor from being conducted to the heat sink via the light-transmitting member.

For example, the display device according to Aspect 3 may be configured so that in Aspect 1 or Aspect 2, when viewed in the direction perpendicular to the front surface of the display panel, the peripheral area of the display panel protrudes outward beyond an outer peripheral part of the light-transmitting member.

According to this aspect, the temperature sensor can be placed at a position where the temperature sensor does not overlap with the light-transmitting member when viewed in a direction perpendicular to the front surface of the display panel.

For example, the display device according to Aspect 4 may be configured so that in any one of Aspects 1 to 3, when a highest temperature region where a temperature is highest due to condensation of sunlight from an outside is present on the front surface of the display panel, a distance between a highest temperature region and the temperature sensor is longer than a distance between a center of the display area and the temperature sensor.

According to this aspect, in such a case that the distance between the highest temperature region and the temperature sensor is longer than the distance between the center of the display area and the temperature sensor, when designing the display device, it is necessary to use the difference between the temperature in the highest temperature region and the temperature detected by the sensor. Even in such a case, by employing the heat sink configuration mentioned above, the difference between the temperature in the highest temperature region and the temperature detected by the temperature sensor can be suppressed to a smaller value.

For example, the display device according to Aspect 5 may be configured so that in any one of Aspects 1 to 3, the display device further includes a light source that emits light onto the back surface of the display panel, and when a highest temperature region where a temperature is highest due to emission of the light from the light source onto the back surface of the display panel is present on the front surface of the display panel, a distance between a highest temperature region and the temperature sensor is longer than a distance between a center of the display area and the temperature sensor.

According to this aspect, in such a case that the distance between the highest temperature region and the temperature sensor is longer than the distance between the center of the display area and the temperature sensor, when designing the display device, it is necessary to use the difference between the temperature in the highest temperature region and the temperature detected by the sensor. Even in such a case, by employing the heat sink configuration mentioned above, the difference between the temperature in the highest temperature region and the temperature detected by the temperature sensor can be suppressed to a smaller value.

For example, the display device according to Aspect 6 may be configured so that in any one of Aspects 1 to 5, the heat sink is in a frame shape including four sides, and among the four sides of the heat sink, a thickness of one side corresponding to the position of the temperature sensor is thinner than a thickness of each of other three sides.

According to this aspect, it is possible to more effectively make it difficult to dissipate heat from the temperature sensor.

For example, the display device according to Aspect 7 may be configured so that in any one of Aspects 1 to 5, the heat sink is in a frame shape including four sides, and among the four sides of the heat sink, a thermal conductivity of one side corresponding to the position of the temperature sensor is lower than a thermal conductivity of each of other three sides.

According to this aspect, it is possible to more effectively make it difficult to dissipate heat from the temperature sensor.

For example, the display device according to Aspect 8 may be configured so that in any one of Aspects 1 to 5, the heat sink is in a frame shape including four sides, and among the four sides of the heat sink, one side corresponding to the position of the temperature sensor is not anodized, and each of other three sides is anodized.

According to this aspect, it is possible to more effectively make it difficult to radiate heat from the temperature sensor.

For example, the display device according to Aspect 9 may be configured so that in any one of Aspects 1 to 8, the display device further includes a heat dissipation sheet held between the heat sink and the light-transmitting member.

According to this aspect, the heat conducted from the display panel to the light-transmitting member can be efficiently conducted to the heat sink via the heat dissipation sheet.

For example, the display device according to Aspect 10 may be configured so that in Aspect 9, the heat sink is in a frame shape including four sides, and the heat dissipation sheet is held between the light-transmitting member and each of three sides other than one side corresponding to the position of the temperature sensor among the four sides of the heat sink.

According to this aspect, it is possible to more effectively make it difficult to dissipate heat from the temperature sensor.

For example, the display device according to Aspect 11 may be configured so that in any one of Aspects 1 to 10, the thermal conductivity of the light-transmitting member is 3 W/mK or less.

According to this aspect, the heat conduction efficiency by the light-transmitting member can be more effectively increased.

For example, the display device according to Aspect 12 may be configured so that in any one of Aspects 1 to 11, the temperature sensor is a thermistor.

According to this aspect, the temperature sensor can be downsized.

In addition, a head-up display according to Aspect 13 of the present disclosure includes the display device according to any one of Aspects 1 to 12; and a mirror that reflects the display light projected from the display device toward a display medium.

According to this aspect, as described above, the difference between the temperature at the center of the display area of the display panel and the temperature detected by the temperature sensor can be kept small.

Hereinafter, embodiments will be specifically described with reference to the drawings.

It should be noted that all embodiments described below show comprehensive or specific examples. The numerical values, shapes, materials, components, arrangement positions and connection forms of the components, steps, order of steps, and the like shown in the following embodiments are examples, and do not limit the present disclosure. In addition, among the components in the following embodiments, components that are not described in the independent claims indicating the broadest concept will be described as optional components.

EMBODIMENT

1. Configuration of Head-Up Display

Figure 2:
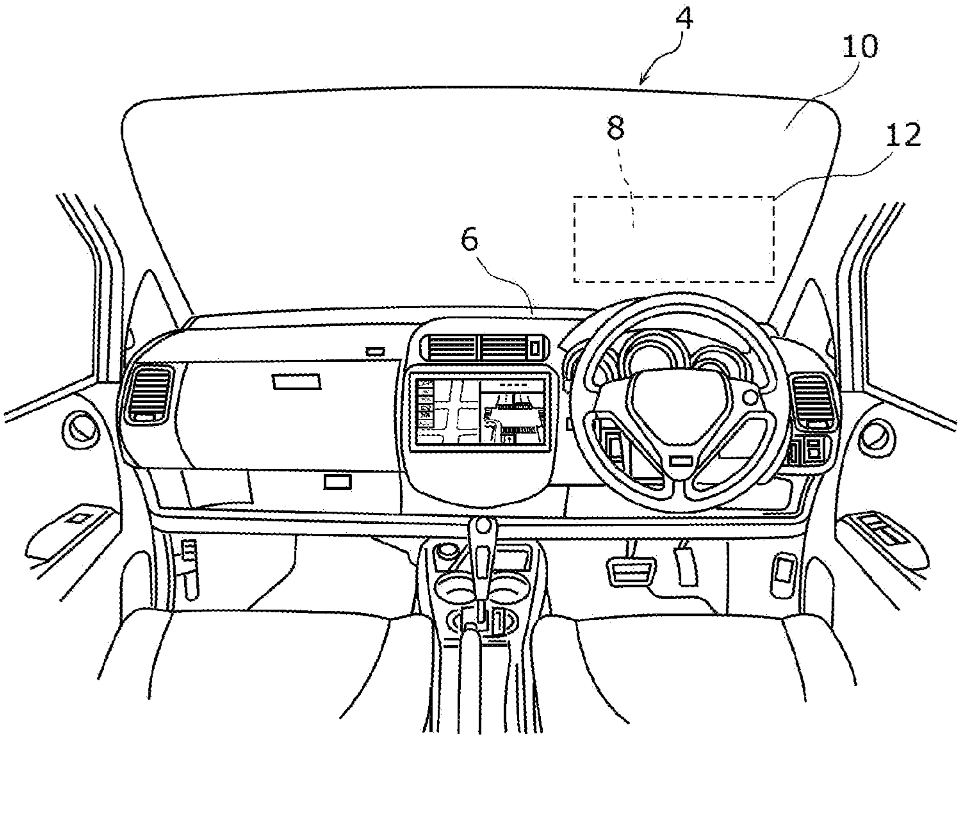
FIG. 2 is a diagram showing an area of the windshield where a HUD image is displayed by the head-up display according to the embodiment.
Figure 3:
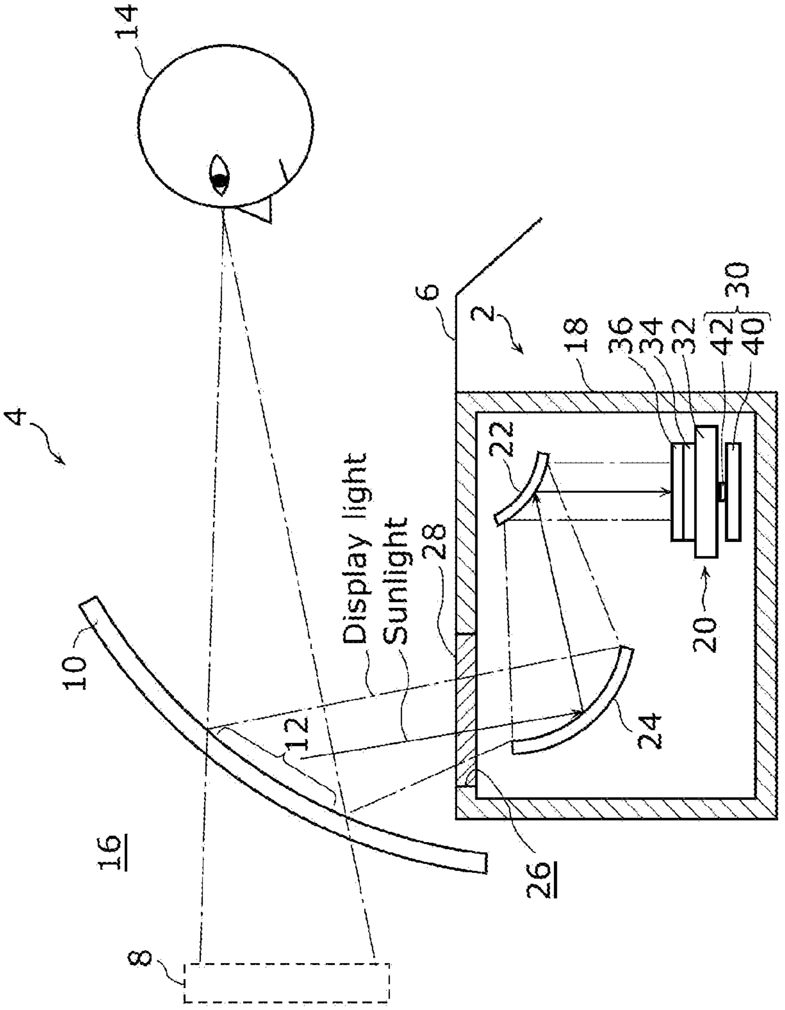
FIG. 3 is a schematic diagram showing a configuration of the head-up display according to the embodiment.

First, the configuration of head-up display 2 according to an embodiment will be described with reference to FIG. 1 to FIG. 3. FIG. 1 is a diagram showing vehicle 4 equipped with head-up display 2 according to the embodiment. FIG. 2 is a diagram showing area 12 of windshield 10 where HUD image 8 is displayed by head-up display 2 according to the embodiment. FIG. 3 is a schematic diagram showing the configuration of head-up display 2 according to the embodiment.

As shown in FIG. 1, head-up display 2 according to the embodiment is disposed inside dashboard 6 of vehicle 4 such as an automobile. As shown in FIG. 1 to FIG. 3, in head-up display 2, by projecting the display light for displaying HUD image 8, which is a virtual image, toward the lower side of windshield 10 (an example of a display medium) of vehicle 4 near the driver's seat, for example, the display light is reflected toward driver 14 by area 12 of windshield 10. Accordingly, driver 14 can see HUD image 8, which is a virtual image, superimposed on the scenery in front of windshield 10 in area 12 of windshield 10. That is, for driver 14, HUD image 8 appears as if it were displayed in space 16 in front of windshield 10.

As shown in FIG. 3, head-up display 2 includes main housing 18, display device 20, first mirror 22 (an example of a mirror), and second mirror 24 (an example of a mirror).

Main housing 18 is in a box shape, and is made of metal such as aluminum, for example. Main housing 18 is disposed inside dashboard 6 of vehicle 4. Display device 20, first mirror 22, and second mirror 24 are disposed inside main housing 18. The upper surface of main housing 18 is disposed to face windshield 10. Opening 26 is formed in the upper surface of main housing 18. This opening 26 is covered with plate-shaped cover member 28 made of, for example, transparent resin.

Display device 20 is a picture generation unit (PGU) that projects display light for displaying HUD image 8 toward first mirror 22. The configuration of display device 20 will be described later.

First mirror 22 is, for example, a convex mirror, and reflects the display light from display device 20 toward second mirror 24. Second mirror 24 is, for example, a concave mirror, and reflects the display light from first mirror 22 toward area 12 of windshield 10. The display light from second mirror 24 is transmitted through cover member 28 and reflected by area 12 of windshield 10, and then enters the eyes of driver 14.

It should be noted that in the present embodiment, head-up display 2 includes two mirrors (first mirror 22 and second mirror 24), but is not limited thereto, and may include one mirror or three or more mirrors.

2. Configuration of the Display Device

Figure 4:
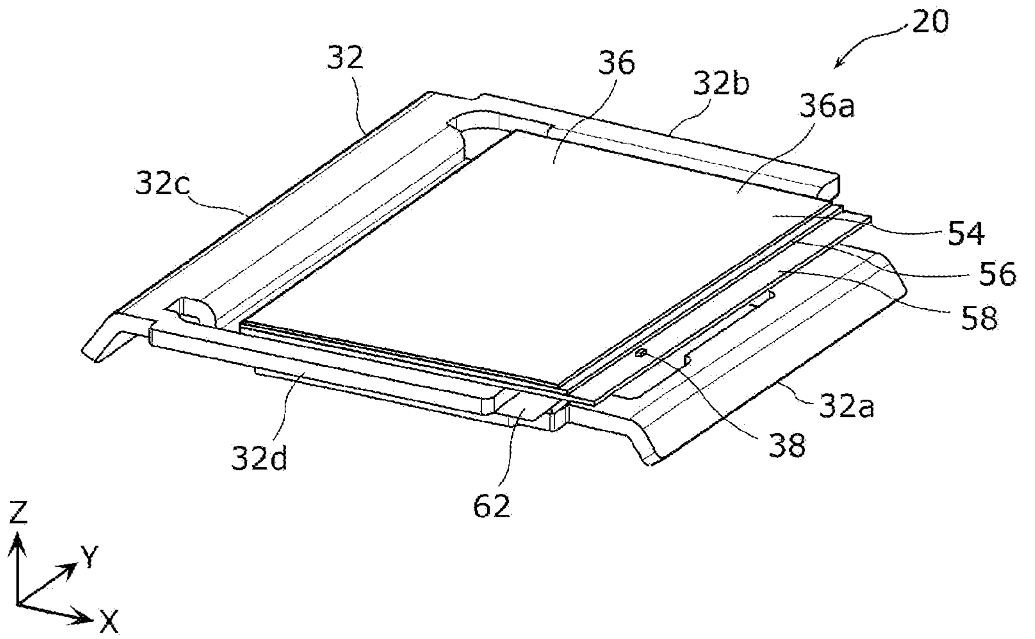
FIG. 4 is a perspective view showing a display device according to the embodiment.
Figure 5:
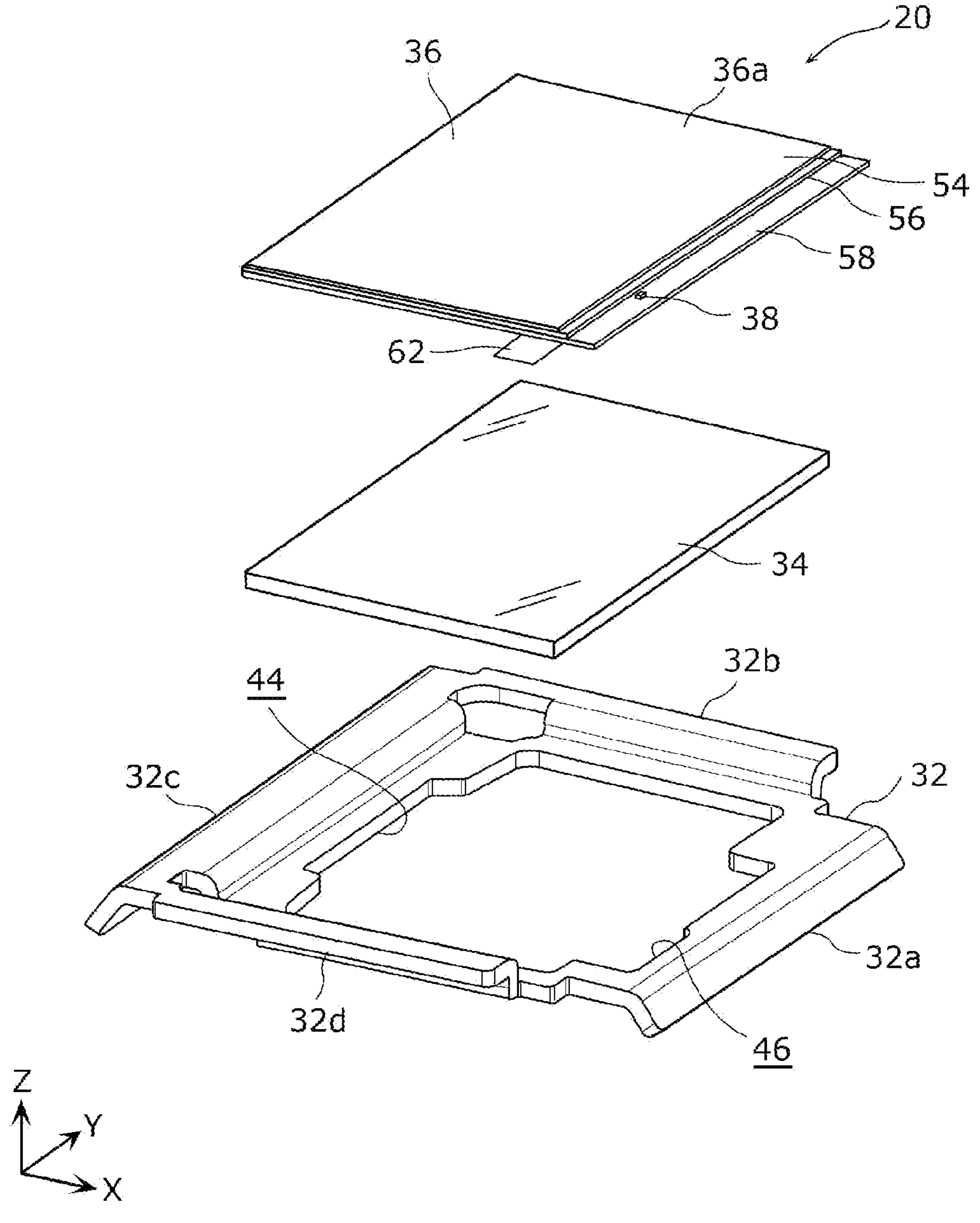
FIG. 5 is an exploded perspective view showing the display device according to the embodiment.
Figure 6:
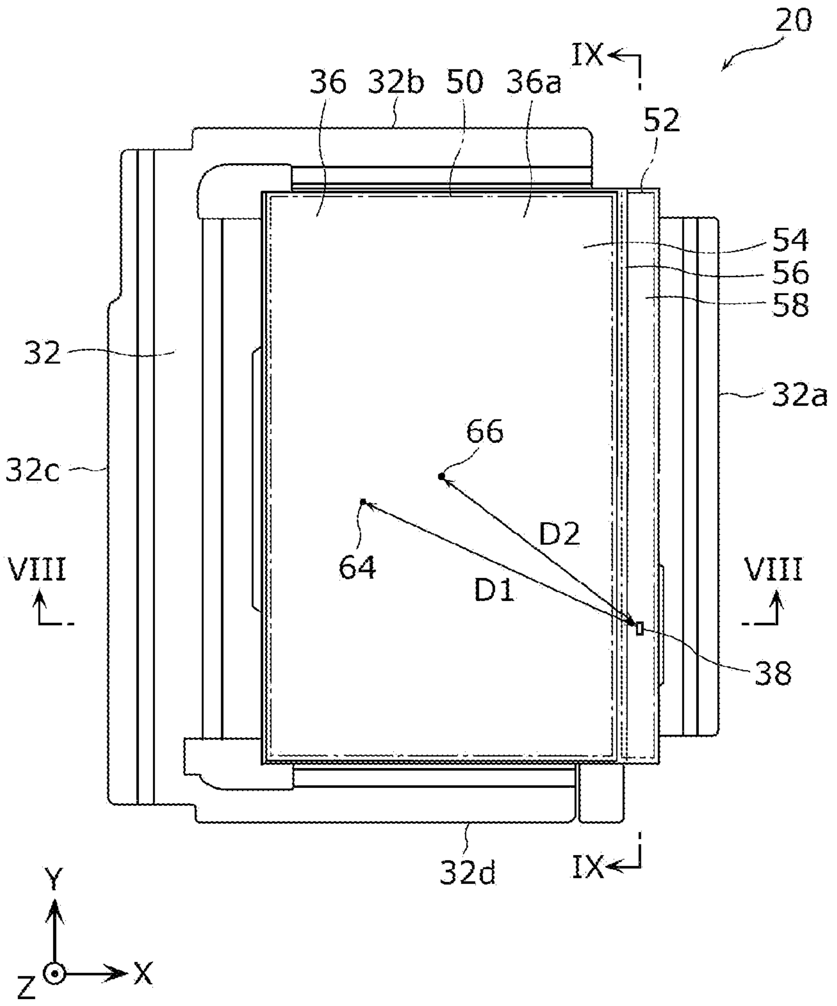
FIG. 6 is a plan view showing the display device according to the embodiment.
Figure 7:
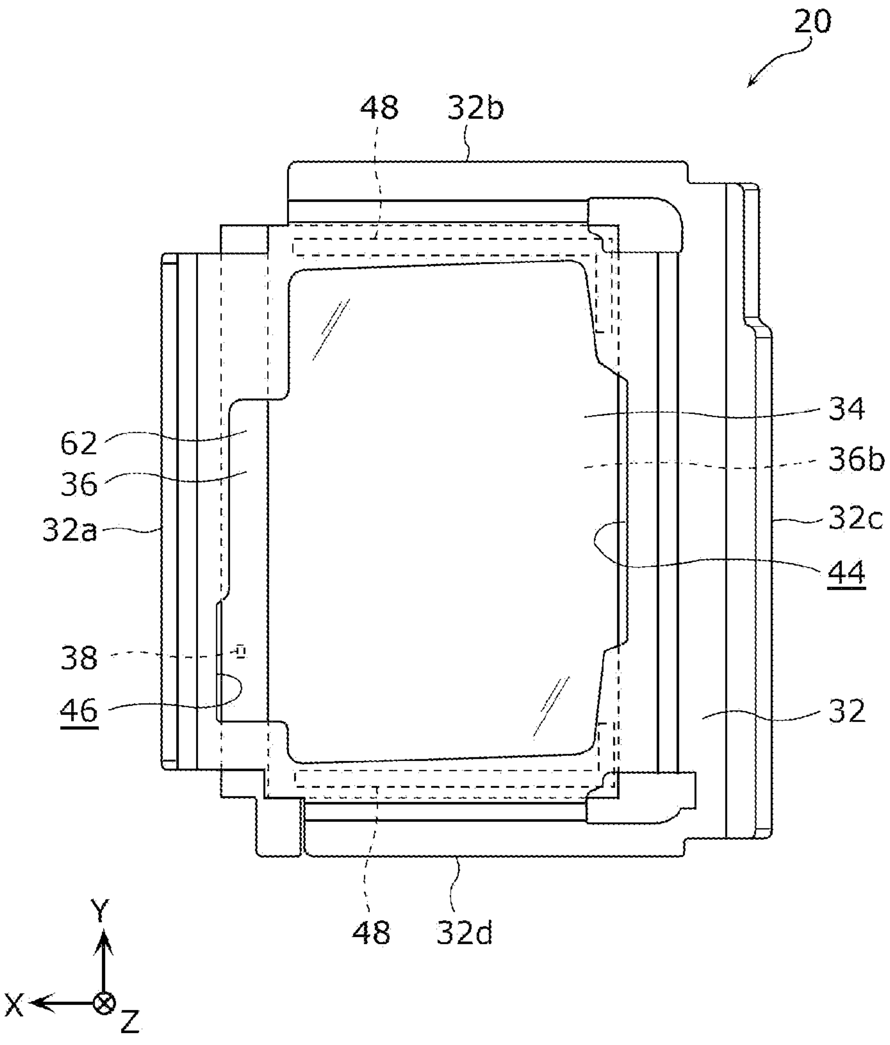
FIG. 7 is a bottom view of the display device according to the embodiment.
Figure 8:
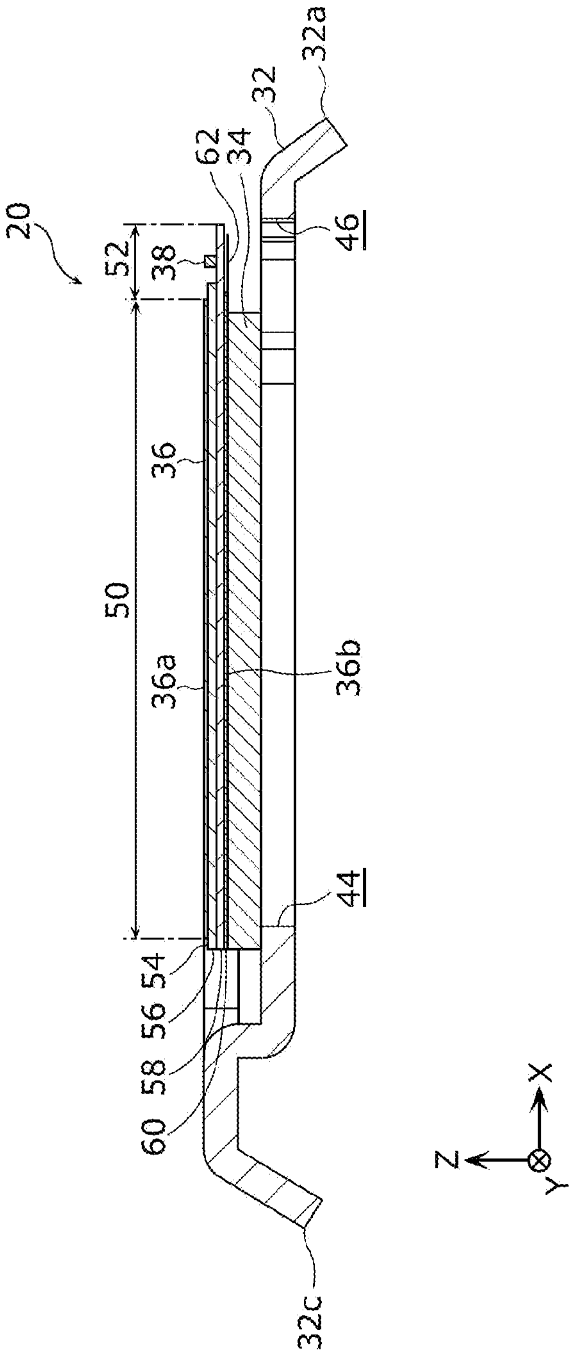
FIG. 8 is a cross-sectional view of the display device according to the embodiment taken along line VIII-VIII in FIG. 6.
Figure 9:
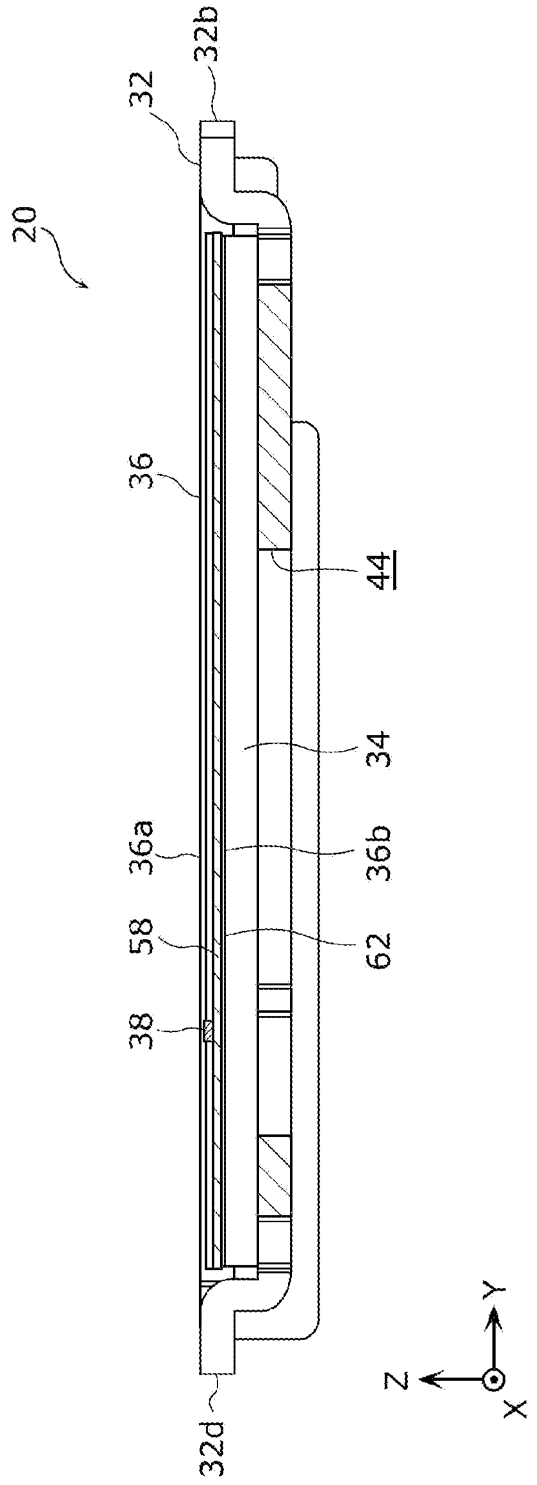
FIG. 9 is a cross-sectional view of the display device according to the embodiment taken along line IX-IX in FIG. 6.
Figure 10:
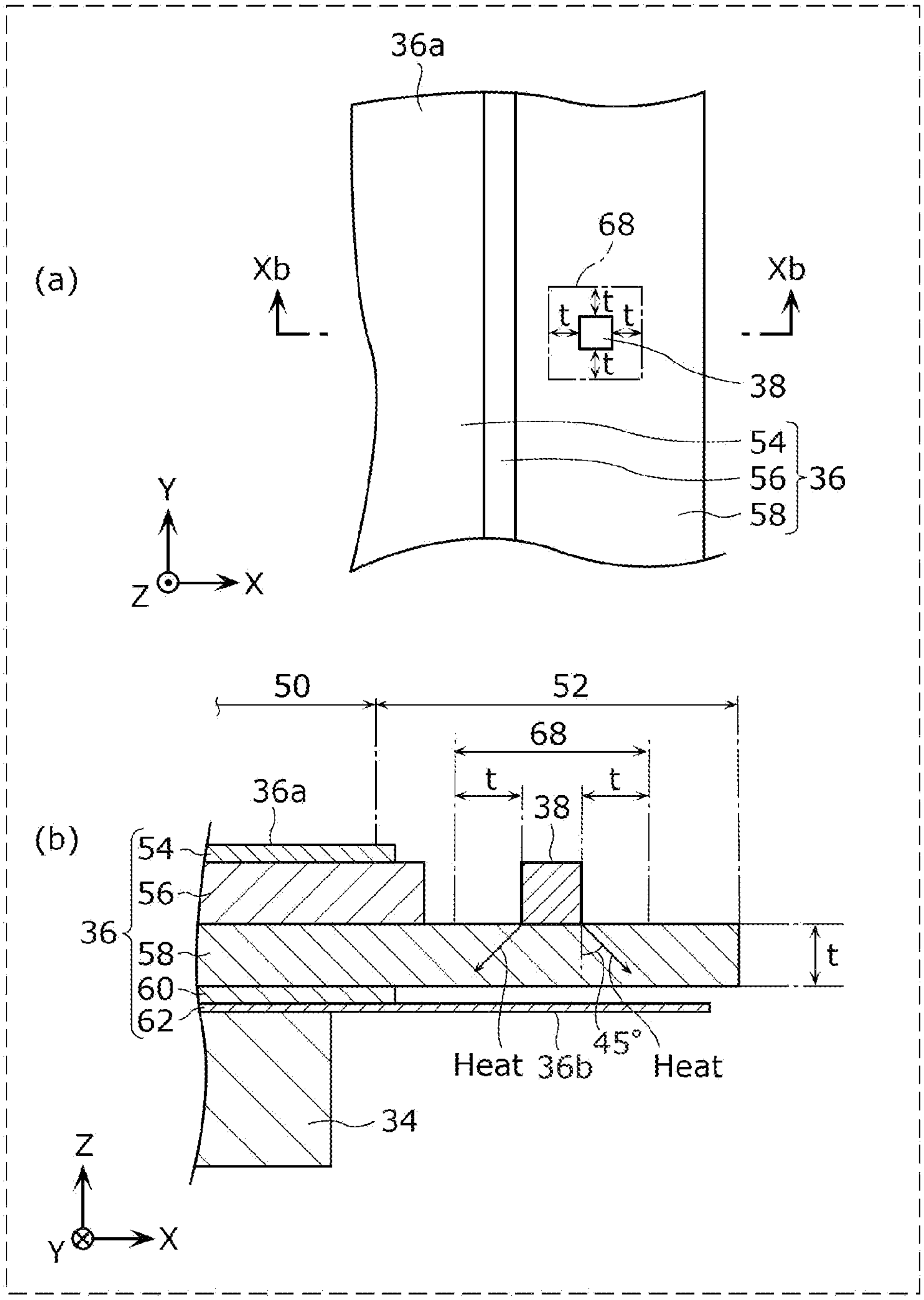
FIG. 10 is an enlarged view of a temperature sensor of the display device according to the embodiment.

Next, the configuration of display device 20 according to the embodiment will be described with reference to FIG. 3 to FIG. 10. FIG. 4 is a perspective view showing display device 20 according to the embodiment. FIG. 5 is an exploded perspective view showing display device 20 according to the embodiment. FIG. 6 is a plan view showing display device 20 according to the embodiment. FIG. 7 is a bottom view showing display device 20 according to the embodiment. FIG. 8 is a cross-sectional view of display device 20 according to the embodiment taken along line VIII-VIII in FIG. 6. FIG. 9 is a cross-sectional view of display device 20 according to the embodiment taken along line IX-IX in FIG. 6. FIG. 10 is an enlarged view of temperature sensor 38 of display device 20 according to the embodiment. Specifically, (a) in FIG. 10 is an enlarged plan view showing temperature sensor 38 of display device 20 according to the embodiment, and (b) in FIG. 10 is a cross-sectional view of display panel 36 and temperature sensor 38 taken along the line Xb-Xb in (a) in FIG. 10.

It should be noted that in FIG. 4 to FIG. 10, the horizontal direction of display panel 36 is the X-axis direction, the vertical direction of display panel 36 is the Y-axis direction, and the thickness direction of display panel 36 is the Z-axis direction. In addition, in FIG. 4 to FIG. 10, the positive side of the Z axis is referred to as "upper", and the negative side of the Z axis is referred to as "lower".

As shown in FIG. 3 to FIG. 9, display device 20 includes a PGU housing (not shown), backlight 30 (an example of a light source) (see FIG. 3), heat sink 32, light-transmitting member 34, display panel 36, and temperature sensor 38.

The PGU housing is fixed inside main housing 18 (see FIG. 3). The PGU housing is formed in a cylindrical shape with a rectangular cross section, for example, and is mainly made of resin. Backlight 30, heat sink 32, light-transmitting member 34, display panel 36, and temperature sensor 38 are disposed inside the PGU housing.

As shown in FIG. 3, backlight 30 is disposed to face opening 44 (described later) of heat sink 32. Backlight 30 includes substrate 40 and light emitting diode (LED) 42 mounted on substrate 40. It should be noted that for convenience of explanation, illustration of backlight 30 is omitted in FIG. 4 to FIG. 9.

Heat sink 32 is for dissipating heat generated by display panel 36, and is made of a metal with high heat dissipation properties, such as aluminum. As shown in FIG. 3, heat sink 32 is disposed to face backlight 30. In addition, as shown in FIG. 8 and FIG. 9, heat sink 32 is disposed to face back surface 36*b* of display panel 36. As shown in FIG. 5 to FIG. 7, heat sink 32 is formed in a substantially rectangular frame shape including four sides 32*a*, 32*b*, 32*c*, and 32*d*, for example, when viewed from the XY plane (that is, viewed in a direction perpendicular to front surface 36*a* of display panel 36). A pair of sides 32*a* and 32*c* face with each other, and a pair of sides 32*b* and 32*d* face with each other.

As shown in FIG. 5 and FIG. 7, opening 44 is formed in heat sink 32 in correspondence with display area 50 (described later) of display panel 36. A part of the lower surface of light-transmitting member 34 (the surface on the side of heat sink 32) is exposed through opening 44 of heat sink 32, so the light from LED 42 of backlight 30 enters back surface 36*b* of display panel 36 through opening 44 of heat sink 32 and light-transmitting member 34. In addition, recess 46 that protrudes radially outward from opening 44 is formed in a region of the peripheral edge of opening 44 that corresponds to the position of temperature sensor 38.

Light-transmitting member 34 is made of a material having light-transmitting properties, such as transparent glass, and is formed in a rectangular plate shape when viewed from the XY plane. Light-transmitting member 34 is a member for conducting heat generated in display panel 36 to heat sink 32, and is held between back surface 36*b* of display panel 36 and the periphery of opening 44 in the upper surface of heat sink 32 (the side of light-transmitting member 34) as shown in FIG. 7 and FIG. 8. That is, the upper surface of light-transmitting member 34 (the surface on the side of display panel 36) is in contact with back surface 36*b* of display panel 36 in a thermally conductive manner, and the lower surface of light-transmitting member 34 is in contact with the periphery of opening 44 on the upper surface of heat sink 32 in a thermally conductive manner. The thermal conductivity of light-transmitting member 34 is preferably 3 W/mK or less.

As shown in FIG. 8, the size of light-transmitting member 34 in the lateral direction (X-axis direction) is smaller than the size of display panel 36 in the lateral direction. In addition, as shown in FIG. 9, the size of light-transmitting member 34 in the longitudinal direction (Y-axis direction) is substantially the same as the size of display panel 36 in the longitudinal direction. It should be noted that light-transmitting member 34 does not necessarily have to be transparent with a transmittance of 100%, and may be transparent with a transmittance lower than 100% (for example, transparent with a transmittance of about 80 to 90%).

It should be noted that as shown in FIG. 7, heat dissipation sheet 48 is interposed between the lower surface of light-transmitting member 34 and the periphery of opening 44 on the upper surface of heat sink 32. Specifically, heat dissipation sheet 48 is held between the region of the periphery of opening 44 on the upper surface of heat sink 32, which corresponds to each of three sides 32*b*, 32*c*, and 32*d* of heat sink 32, and lower surface of light-transmitting member 34. Accordingly, a region of the periphery of opening 44 on the upper surface of heat sink 32 that corresponds to one side 32*a* of heat sink 32 directly contacts the lower surface of light-transmitting member 34. In addition, a region of the periphery of opening 44 on the upper surface of heat sink 32 that corresponds to each of three sides 32*b*, 32*c*, and 32*d* of heat sink 32 contact the lower surface of light-transmitting member 34 via heat dissipation sheet 48. Heat dissipation sheet 48 is a heat conductive member having relatively high thermal conductivity, and is mainly a silicone resin-based sheet.

Display panel 36 is, for example, a liquid crystal display (LCD), and is formed in a rectangular plate shape when viewed from the XY plane. Back surface 36*b* of display panel 36 is disposed to face the upper surface of light-transmitting member 34, and is in contact with the upper surface of light-transmitting member 34 in a thermally conductive manner.

As shown in FIG. 6 and FIG. 8, display area 50 for displaying an image is formed on front surface 36*a* (the surface opposite to back surface 36*b*) of display panel 36. Display area 50 includes a rectangular outer shape in an XY plane view, and the size of display area 50 is smaller than the entire size of front surface 36*a* of display panel 36. Peripheral area 52 is formed outward from display area 50 on front surface 36*a* of display panel 36, which does not contribute to image display (that is, through which light entering back surface 36*b* of display panel 36 does not pass). In peripheral area 52, wiring patterns, electrodes, and the like (not shown) are formed. In the present embodiment, peripheral area 52 is disposed along one side 32*a* of heat sink 32. It should be noted that peripheral area 52 may be formed in a frame shape so as to surround the entire periphery of display area 50.

Here, the specific configuration of display panel 36 will be described with reference to (b) in FIG. 10. As shown in (b) in FIG. 10, display panel 36 is configured by stacking, for example, first polarizing plate 54, first glass plate 56, second glass plate 58, second polarizing plate 60, and diffusion plate 62 (an example of a plurality of optical members) in this order. Diffusion plate 62 is disposed on the side of light-transmitting member 34, and first polarizing plate 54 is disposed on the side opposite to light-transmitting member 34. One end of second glass plate 58 in the lateral direction (X-axis direction) protrudes laterally (on the plus side of the X-axis) from one ends of first polarizing plate 54, first glass plate 56, and second polarizing plate 60 in their respective lateral directions. That is, one end of second glass plate 58 in the lateral direction protrudes further to the side than the one end of light-transmitting member 34 in the lateral direction. It should be noted that the upper surface at one end in the lateral direction of second glass plate 58 that protrudes laterally defines peripheral area 52 mentioned above. Accordingly, peripheral area 52 comes to protrude outward from the outer peripheral portion of light-transmitting member 34.

The light entering back surface 36*b* of display panel 36 passes through display panel 36 and exits from display area 50. That is, display panel 36 projects the light that has passed through display area 50 as display light representing the image displayed on display area 50.

Temperature sensor 38 is a sensor for detecting the temperature of display panel 36, and includes, for example, a thermistor. As shown in (a) in FIG. 10, temperature sensor 38 is formed, for example, in a rectangular shape including four sides when viewed from the XY plane. As shown in FIG. 6 to FIG. 8, temperature sensor 38 is disposed on the upper surface of second glass plate 58 at one end in the lateral direction, which is disposed in peripheral area 52 of display panel 36 and expands outward from the outer periphery of light-transmitting member 34. Specifically, when viewed in a direction perpendicular to front surface 36*a* of display panel 36, temperature sensor 38 is disposed at a position where temperature sensor 38 does not overlap with both heat sink 32 and light-transmitting member 34.

That is, both heat sink 32 and light-transmitting member 34 are not present directly below temperature sensor 38 when viewed in a direction perpendicular to front surface 36*a* of display panel 36. This is because, as mentioned above, recess 46 is formed in a region of the periphery of opening 44 of heat sink 32 that corresponds to the position of temperature sensor 38, and peripheral area 52 of display panel 36 corresponding to the position of temperature sensor 38 protrudes outward from the outer periphery of light-transmitting member 34.

3. Effects

As shown in FIG. 3, during the day, sunlight enters the vehicle interior from the outside of vehicle 4 through windshield 10. The sunlight that has entered the vehicle interior enters the interior of main housing 18 through cover member 28 of head-up display 2, is reflected by second mirror 24 and first mirror 22, respectively, and enters front surface 36*a* of display panel 36 of display device 20. Accordingly, sunlight is concentrated on front surface 36*a* of display panel 36 of display device 20, and heat due to the sunlight is generated in display panel 36.

In addition, by the light from backlight 30 being emitted onto back surface 36*b* of display panel 36, heat due to the light from backlight 30 is generated in display panel 36.

Heat generated in display panel 36 due to sunlight and/or light from backlight 30 is conducted to heat sink 32 via light-transmitting member 34 and dissipated into the atmosphere while diffusing inside heat sink 32.

At this time, as mentioned above, temperature sensor 38 is disposed at a position where temperature sensor 38 does not overlap with both heat sink 32 and light-transmitting member 34 when viewed in a direction perpendicular to front surface 36*a* of display panel 36. As a result, the heat from temperature sensor 38 is difficult to be conducted to heat sink 32 via light-transmitting member 34, and the difference between the temperature at the center of display area 50 of display panel 36 and the temperature detected by temperature sensor 38 becomes smaller (for example, about 15 to 30° C.).

Incidentally, head-up display 2 includes a controller (not shown) that executes a fail-safe function to thermally protect display panel 36 based on the temperature detected by temperature sensor 38. The controller estimates a temperature higher than the temperature detected by temperature sensor 38 by a predetermined temperature (for example, 25° C.) as the temperature at the center of display area 50 of display panel 36. Then, when the estimated temperature at the center of display area 50 exceeds a threshold value (for example, 103° C.), the controller controls, for example, the displacement of at least one of first mirror 22 or second mirror 24 and the reduction of the luminous intensity of LED 42 of backlight 30 as a fail-safe function.

Although not shown, in the conventional head-up display described in the background section, the temperature sensor overlaps with both the heat sink and the light-transmitting member when viewed in the direction perpendicular to the front surface of the display panel. As a result, the heat from the temperature sensor is easily conducted to the heat sink through the light-transmitting member, and the difference between the temperature at the center of the display area of the display panel and the temperature detected by the temperature sensor becomes large (for example, about 50 to 60° C.). However, when the temperature difference increases in this way, the frequency of occurrence of the fail-safe function increases, and the problem that HUD image 8 (virtual image) is dark for driver 14 or HUD image 8 is not displayed is likely to occur.

On the other hand, in the configuration of head-up display 2 according to the embodiment, as mentioned above, the heat of temperature sensor 38 is difficult to be conducted to heat sink 32 via light-transmitting member 34, and the difference between the temperature at the center of display area 50 of display panel 36 and the temperature detected by temperature sensor 38 becomes smaller. As a result, such an effect is obtained that the temperature at the center of display area 50 of display panel 36 can be estimated with high accuracy, and the fail-safe function is correctly executed.

It should be noted that as shown in FIG. 6, sunlight from the outside is concentrated on front surface 36*a* of display panel 36 (or light from backlight 30 is emitted on back surface 36*b* of display panel 36), and there may be highest temperature region 64 where the temperature is the highest. In such a case, distance D1 between highest temperature region 64 and temperature sensor 38 is preferably longer than distance D2 between center 66 of display area 50 and temperature sensor 38 for the following reason. Normally, center 66 of display area 50 has the highest temperature, so when designing display device 20, the difference between the temperature at center 66 and the temperature detected by temperature sensor 38 is used. On the other hand, in such a case that distance D1 between highest temperature region 64 and temperature sensor 38 is longer than distance D2 between center 66 and temperature sensor 38, when designing display device 20, it is necessary to use the difference between the temperature in highest temperature region 64 and the temperature detected by temperature sensor 38, rather than the difference between the temperature at center 66 and the temperature detected by temperature sensor 38. In such a case, by employing the configuration of heat sink 32 according to the embodiment, the difference between the temperature in highest temperature region 64 and the temperature detected by temperature sensor 38 can be suppressed to a smaller value.

In addition, as shown in (a) and (b) in FIG. 10, when viewed in a direction perpendicular to front surface 36*a* of display panel 36, predetermined area 68 including temperature sensor 38 is preferably disposed at a position where predetermined area 68 does not overlap with both of heat sink 32 and light-transmitting member 34. Here, predetermined area 68 is an area expanded outward from the four sides (outermost shape) of temperature sensor 38 by more than or equal to thickness t (size in the Z-axis direction) of second glass plate 58, respectively, when viewed in a direction perpendicular to front surface 36*a* of display panel 36. If second glass plate 58 is formed of isotropic material, the heat from temperature sensor 38 will spread inside second glass plate 58 at an angle of about 45° to the vertical line (Z axis direction). At this time, when viewed in a direction perpendicular to front surface 36*a* of display panel 36, predetermined area 68, that is, the area where the heat from temperature sensor 38 spreads, is disposed at a position where predetermined area 68 does not overlap with both heat sink 32 and light-transmitting member 34. Accordingly, it is possible to more effectively suppress heat from temperature sensor 38 from being conducted to heat sink 32 via light-transmitting member 34.

(Other Variations)

Although the display device according to one or more aspects has been described above based on the above embodiment, the present disclosure is not limited to the above embodiment. Forms obtained by applying various modifications to the above embodiment conceived by a person skilled in the art or forms realized by combining the components in different embodiments without departing from the spirit of the present disclosure are also included in the scope of one or more aspects.

For example, in the above embodiment, the display light from display device 20 is reflected by area 12 of windshield 10, but the present invention is not limited thereto, and the display light from display device 20 may be reflected by a combiner (an example of a display medium).

In addition, in the above embodiment, temperature sensor 38 is disposed at a position where temperature sensor 38 does not overlap with both heat sink 32 and light-transmitting member 34, but the present invention is not limited thereto. It may be disposed at a position where temperature sensor 38 does not overlap with either one.

In addition, in the above embodiment, heat sink 32 is in a frame shape, but among four sides 32*a*, 32*b*, 32*c*, and 32*d* of heat sink 32, the thickness of one side 32*a* corresponding to the position of temperature sensor 38 may be thinner than the thickness of each of other three sides 32*b*, 32*c*, and 32*d*. Accordingly, it is possible to more effectively make it difficult to dissipate heat from temperature sensor 38.

Alternatively, among four sides 32*a*, 32*b*, 32*c*, and 32*d* of heat sink 32, the thermal conductivity of one side 32*a* corresponding to the position of temperature sensor 38 may be set lower than the thermal conductivity of each of other three sides 32*b*, 32*c*, and 32*d*. Also, by such a configuration, it is possible to more effectively make it difficult to dissipate heat of temperature sensor 38.

Alternatively, among four sides 32*a*, 32*b*, 32*c*, and 32*d* of heat sink 32, one side 32*a* corresponding to the position of temperature sensor 38 may not be anodized, and each of other three sides 32*b*, 32*c*, and 32*d* may be anodized. Also, by such a configuration, it is possible to more effectively make it difficult to dissipate heat of temperature sensor 38.

While various embodiments have been described herein above, it is to be appreciated that various changes in form and detail may be made without departing from the spirit and scope of the present disclosure as presently or hereafter claimed.

Further Information about Technical Background to this Application

The disclosure of the following patent application including specification, drawings, and claims are incorporated herein by reference in their entirety: Japanese Patent Application No. 2023-025324 filed on Feb. 21, 2023.

INDUSTRIAL APPLICABILITY

The display device according to the present disclosure is applicable to, for example, a PGU installed in a head-up display for a vehicle, and the like.

What is claimed is:

1. A display device for use in a head-up display, the display device comprising:

a display panel that includes a display area that displays an image on a front surface and a peripheral area located outside the display area, and that projects light incident on a back surface from the display area as display light that represents the image;

a heat sink disposed to face the back surface of the display panel;

a light-transmitting member held between the display panel and the heat sink; and a temperature sensor disposed in the peripheral area of the display panel to detect a temperature of the display panel, wherein when viewed in a direction perpendicular to the front surface of the display panel, the temperature sensor does not overlap with at least one of the heat sink or the light-transmitting member, and when a highest temperature region where a temperature is highest due to condensation of sunlight from an outside is present on the front surface of the display panel, a distance between the highest temperature region and the temperature sensor is longer than a distance between a center of the display area and the temperature sensor.

2. The display device according to claim 1, wherein the display panel includes a plurality of optical members stacked, and when viewed in the direction perpendicular to the front surface of the display panel, a predetermined area including the temperature sensor is an area expanded outward from an outermost shape of the temperature sensor by more than or equal to a thickness of one or more optical members of the plurality of optical members, and is disposed at a position where the predetermined area does not overlap with at least one of the heat sink or the light-transmitting member.

3. The display device according to claim 1, when viewed in the direction perpendicular to the front surface of the display panel, the peripheral area of the display panel protrudes outward beyond an outer peripheral part of the light-transmitting member.

4. A display device for use in a head-up display, the display device comprising:

a display panel that includes a display area that displays an image on a front surface and a peripheral area located outside the display area, and that projects light incident on a back surface from the display area as display light that represents the image;

a heat sink disposed to face the back surface of the display panel;

a light-transmitting member held between the display panel and the heat sink; and a temperature sensor disposed in the peripheral area of the display panel to detect a temperature of the display panel, and a light source that emits light onto the back surface of the display panel, wherein when viewed in a direction perpendicular to the front surface of the display panel, the temperature sensor does not overlap with at least one of the heat sink or the light-transmitting member, and when a highest temperature region where a temperature is highest due to emission of the light from the light source onto the back surface of the display panel is present on the front surface of the display panel, a distance between the highest temperature region and the temperature sensor is longer than a distance between a center of the display area and the temperature sensor.

5. The display device according to claim 1, wherein the heat sink is in a frame shape including four sides, and among the four sides of the heat sink, a thickness of one side corresponding to a position of the temperature sensor is thinner than a thickness of each of other three sides.

6. A display device for use in a head-up display, the display device comprising:

a display panel that includes a display area that displays an image on a front surface and a peripheral area located outside the display area, and that projects light incident on a back surface from the display area as display light that represents the image;

a heat sink disposed to face the back surface of the display panel;

a light-transmitting member held between the display panel and the heat sink; and a temperature sensor disposed in the peripheral area of the display panel to detect a temperature of the display panel, wherein the heat sink is in a frame shape including four sides, among the four sides of the heat sink, a thermal conductivity of one side corresponding to a position of the temperature sensor is lower than a thermal conductivity of each of other three sides, and when viewed in a direction perpendicular to the front surface of the display panel, the temperature sensor does not overlap with at least one of the heat sink or the light-transmitting member.

7. The display device according to claim 1, wherein the heat sink is in a frame shape including four sides, and among the four sides of the heat sink, one side corresponding to a position of the temperature sensor is not anodized, and each of other three sides is anodized.

8. The display device according to claim 1, further comprising:

a heat dissipation sheet held between the heat sink and the light-transmitting member.

9. The display device according to claim 8, wherein the heat sink is in a frame shape including four sides, and the heat dissipation sheet is held between the light-transmitting member and each of three sides other than one side corresponding to the position of the temperature sensor among the four sides of the heat sink.

10. The display device according to claim 1, wherein a thermal conductivity of the light-transmitting member is 3 W/mK or less.

11. The display device according to claim 1, wherein the temperature sensor is a thermistor.

12. A head-up display comprising:

the display device according to claim 1; and a mirror that reflects the display light projected from the display device toward a display medium.

* * * * *